United States Patent
Wierer, Jr. et al.

(10) Patent No.: US 7,804,100 B2
(45) Date of Patent: Sep. 28, 2010

(54) POLARIZATION-REVERSED III-NITRIDE LIGHT EMITTING DEVICE

(75) Inventors: Jonathan J. Wierer, Jr., Fremont, CA (US); M. George Craford, Los Altos Hills, CA (US); John E. Epler, Milpitas, CA (US); Michael R. Krames, Mountain View, CA (US)

(73) Assignees: Philips Lumileds Lighting Company, LLC, San Jose, CA (US); Koninklijke Philips Electronics N.V., Eindhoven (NL)

( * ) Notice: Subject to any disclaimer, the term of this patent is extended or adjusted under 35 U.S.C. 154(b) by 241 days.

(21) Appl. No.: 11/080,022

(22) Filed: Mar. 14, 2005

(65) Prior Publication Data

US 2006/0202215 A1    Sep. 14, 2006

(51) Int. Cl.
*H01L 27/15* (2006.01)

(52) U.S. Cl. .................. 257/94; 257/96; 257/E21.087; 257/E21.088; 257/E21.122; 257/E21.567; 257/E33.025; 257/E33.028; 257/E33.033; 257/E33.034; 257/E33.03; 438/455

(58) Field of Classification Search .................. 257/94, 257/E33.025, E33.034, E21.122, E21.087, 257/E21.088, 96, E21.567, E33.028, E33.03, 257/E33.033; 438/455

See application file for complete search history.

(56) References Cited

U.S. PATENT DOCUMENTS

| 5,376,580 | A |   | 12/1994 | Kish et al. |
|---|---|---|---|---|
| 5,432,808 | A | * | 7/1995 | Hatano et al. ............. 372/45.01 |
| 5,502,316 | A |   | 3/1996 | Kish et al. |
| 5,661,316 | A |   | 8/1997 | Kish, Jr. et al. |
| 5,779,924 | A |   | 7/1998 | Krames et al. |
| 5,783,477 | A |   | 7/1998 | Kish, Jr. et al. |
| 5,793,062 | A |   | 8/1998 | Kish, Jr. et al. |
| 5,917,202 | A |   | 6/1999 | Haitz et al. |
| 6,177,359 | B1 |   | 1/2001 | Chen et al. |
| 6,191,437 | B1 | * | 2/2001 | Sonobe et al. ................. 257/94 |
| 6,274,924 | B1 |   | 8/2001 | Carey et al. |
| 6,298,079 | B1 | * | 10/2001 | Tanaka et al. ............ 372/46.01 |
| 6,320,206 | B1 |   | 11/2001 | Coman et al. |
| 6,420,199 | B1 |   | 7/2002 | Coman et al. |
| 6,468,923 | B1 |   | 10/2002 | Yonehara et al. |
| 6,486,499 | B1 |   | 11/2002 | Krames et al. |
| 6,515,313 | B1 | * | 2/2003 | Ibbetson et al. ............. 257/103 |
| 6,525,335 | B1 |   | 2/2003 | Krames et al. |

(Continued)

FOREIGN PATENT DOCUMENTS

EP    1385215 A2    1/2004

OTHER PUBLICATIONS

Oder et al., "III-nitride blue and ultraviolet photonic crystal light emitting diodes", Applied Physics Letters 84 (2004) pp. 466-468.*

(Continued)

*Primary Examiner*—Kenneth A Parker
*Assistant Examiner*—Jay C Kim

(57) ABSTRACT

A device structure includes a III-nitride wurtzite semiconductor light emitting region disposed between a p-type region and an n-type region. A bonded interface is disposed between two surfaces, one of the surfaces being a surface of the device structure. The bonded interface facilitates an orientation of the wurtzite c-axis in the light emitting region that confines carriers in the light emitting region, potentially increasing efficiency at high current density.

16 Claims, 7 Drawing Sheets

U.S. PATENT DOCUMENTS

| | | | |
|---|---|---|---|
| 6,526,082 | B1 | 2/2003 | Corzine et al. |
| 6,569,704 | B1 | 5/2003 | Takeuchi et al. |
| 6,570,190 | B2 | 5/2003 | Krames et al. |
| 6,800,500 | B2 | 10/2004 | Coman et al. |
| 6,849,472 | B2 | 2/2005 | Krames et al. |
| 7,221,000 | B2 * | 5/2007 | Shen et al. .................... 257/94 |
| 2002/0070125 | A1 * | 6/2002 | Ng et al. .................... 205/640 |
| 2002/0110172 | A1 | 8/2002 | Hasnain et al. |
| 2002/0171080 | A1 | 11/2002 | Faris |
| 2002/0179918 | A1 * | 12/2002 | Sung et al. .................... 257/99 |
| 2003/0141507 | A1 | 7/2003 | Krames et al. |
| 2005/0163179 | A1 * | 7/2005 | Hooper et al. ................ 372/45 |
| 2006/0197100 | A1 | 9/2006 | Shen et al. |

OTHER PUBLICATIONS

Wong et al., "Structural and optical quality of GaN/metal/Si heterostructures fabricated by eximer laser lift-off", Applied Physics Letters 75 (1999) pp. 1887-1889.*

Funato et al., "Integration of GaN with Si using a AuGe-mediated wafer bonding technique", Applied Physics Letters 77 (2000) pp. 3959-3961.*

Yang et al., "P-Type GaN Formation by Mg Diffusion", Japan J. Appl. Phys. vol. 39 (May 2000) pp. L390-L392.

Moon et al., "Recovery of Dry-Etch-Induced Surface Damage on Mg-Doped GaN by NH3 Ambient Thermal Annealing", J. Vac. Sci. Technol. B 22(2), Mar./Apr. 2004, pp. 489-491.

Tavernier et al., "The Growth of N-Face GaN by MOCVD: Effect of Mg, Si, and In", Journal of Crystal Growth 264 (2004) pp. 150-158.

Shi et al., "Interface Structure and Adhesion of Wafer-Bonded GaN/GaN and GaN/AlGaN Semiconductors", Journal of Applied Physics, vol. 95, No. 3, Feb. 2004, pp. 909-912.

Miskys et al., "MOCVD-Epitaxy on Free-Standing HVPE-GaN Substrates".

Tokuda et al., "Wafer Fusion Technique Applied to GaN/GaN System", Japan J. Appl. Phys. vol. 39 (Jun. 2000), pp. L572-L574.

Studnitzky et al., "Phase Formation and Diffusion Soldering in Pt/In, Pd/In, and Zr/Sn Thin-Film Systems", Journal of Electronic Materials, vol. 32, No. 2, 2003, pp. 70-80.

Kim et al., "Heterogeneous Silicon Integration by Ultra-High Vacuum Wafer Bonding", Journal of Electronic Materials, vol. No. 8, 2003, pp. 849-854.

Wong et al., "Integration of GaN Thin Films with Dissimilar Substrate Materials by Pd-In Metal Bonding and laser Lift-Off", Journal of Electronic Materials, vol. 28, No. 12, 1999, pp. 1409-1413.

Zolper et al., "Ion Implantation and Rapid Thermal Processing of III-V Nitrides", Journal of Electronic Materials, vol. 25, No. 15, 1996, pp. 839-844.

Yu et al., "Electrical and Optical Properties of Beryllium-Implanted Mg-Doped GaN", Journal of Applied Physics, vol. 92, No. 4, Aug. 2002, pp. 1881-1887.

Yu et al., "Beryllium-Implanted P-Type GaN with High Carrier Concentration", Japan J. Appl. Phys. vol. 40 (May 2001), pp. L417-L419.

Kent et al., "Co-Implantation of Be+O and Mg+O into GaN", Journal of Applied Physics, vol. 90, No. 8, Oct. 2001, pp. 3750-3753.

Nakano et al., "Effect of Be+ + O+ Coimplantation on Be Acceptors in GaN", Applied Physics Letters, vol. 82, No. 13, Mar. 2003, pp. 2082-2084.

J.L. Weyher et al, Morphological and Structural Characteristics of Homoepitaxial GaN Grown by Metalorganic Chemical Vapour Deposition (MOCVD), Journal of Crystal Growth 204, 1999, pp. 419-428.

M. Stutzmann et al, "Playing with Polarity", Phys. Stat. Sol. (b) 228, No. 2, 2001, pp. 505-512.

J.J. Wierer et al, "InGaN/GaN Quantum-Well Heterostructure Light-Emitting Diodes Employing Photonic Crystal Structures", Applied Physics Letters, vol. 84, No. 19, May 10, 2004, pp. 3885-3887.

H. Wada et al, "Novel Current-Blocking Laser Structures Using Directly-Bonded InP-SiO2-InP", Proceedings of the International Conference On Indium Phosphide and Related Materials, May 9, 1995, pp. 777-780.

* cited by examiner

POLARIZATION-REVERSED III-NITRIDE LIGHT EMITTING DEVICE

BACKGROUND

1. Field of Invention

This invention relates to a semiconductor light emitting device with a polarization-reversed light emitting region, and methods of making such a device.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, a light emitting or active region formed over the n-type layer or layers, and one or more p-type layers doped with, for example, Mg, formed over the active region. III-nitride devices formed on conductive substrates may have the p- and n-contacts formed on opposite sides of the device. Often, III-nitride devices are fabricated on insulating substrates, such as sapphire, with both contacts on the same side of the device. Such devices are mounted so light is extracted either through the contacts (known as an epitaxy-up device) or through a surface of the device opposite the contacts (known as a flip chip device).

Needed in the art are III-nitride light emitting devices that operate efficiently at high current density.

SUMMARY

In accordance with embodiments of the invention, a device structure includes a III-nitride wurtzite semiconductor light emitting region disposed between a p-type region and an n-type region. A bonded interface is disposed between two surfaces, one of the surfaces being a surface of the device structure. The bonded interface facilitates an orientation of the wurtzite c-axis in the light emitting region that confines carriers in the light emitting region, potentially increasing efficiency at high current density.

DETAILED DESCRIPTION

Figure 1:
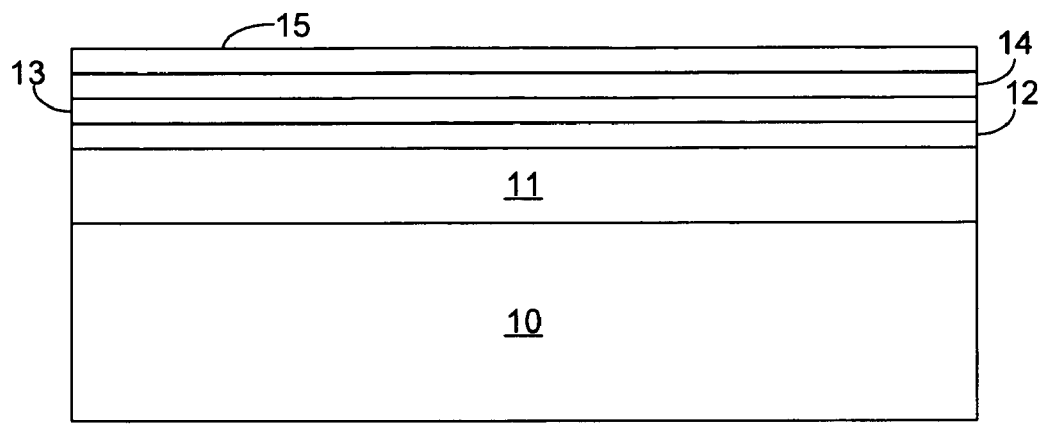
FIG. 1 illustrates a III-nitride light emitting device.

FIG. 1 illustrates a common III-nitride light emitting device. An n-type region 11 is grown over a sapphire substrate 10. An active region 12, which may include multiple quantum wells separated by barrier layers, is grown over n-type region 11, followed by a GaN spacer layer 13, a p-type AlGaN layer 14, and a p-type contact layer 15.

Figure 14:
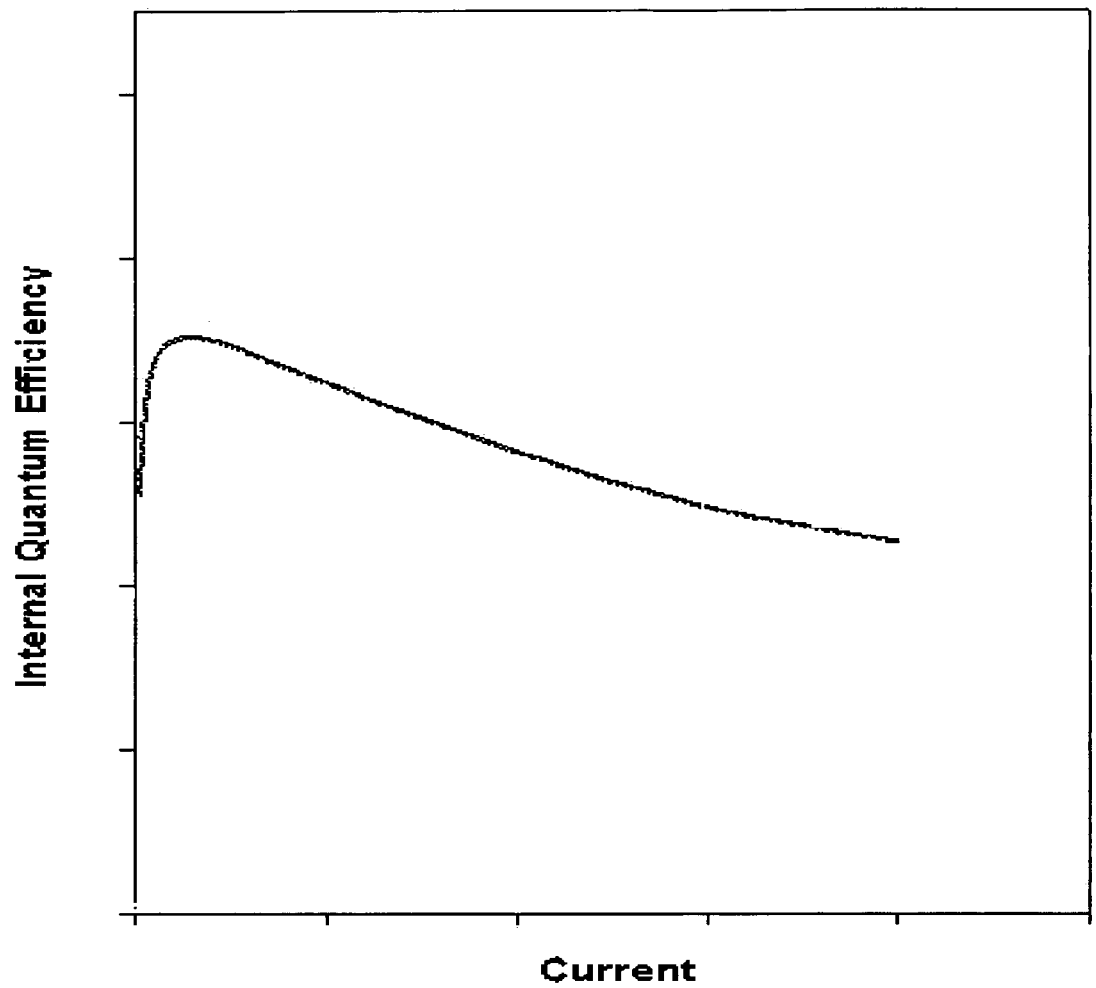
FIG. 14 is a plot of quantum efficiency as a function of current density.

As the current density applied to the device of FIG. 1 increases, the internal quantum efficiency of the device, defined as the ratio of the flux of photons generated to the flux of carriers supplied, initially increases, then decreases, as illustrated in FIG. 14. The decrease in internal quantum efficiency at high current density may be at least partially caused by electron leakage from the active region due to the design of the device of FIG. 1. Also, electron leakage limits the peak efficiency of the device.

Figure 2:
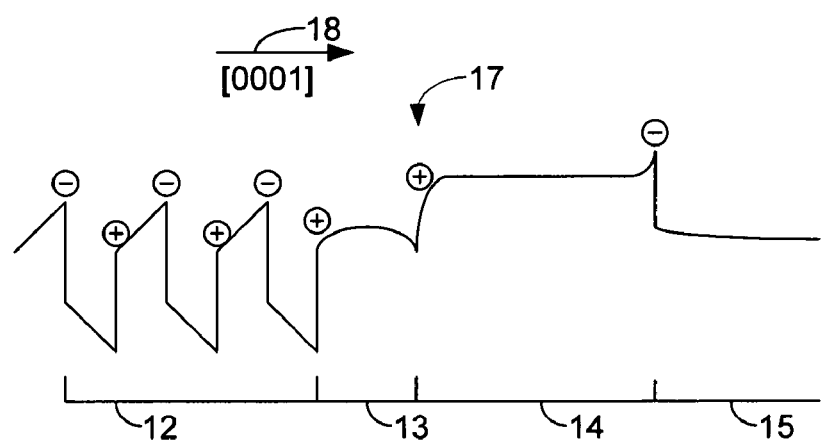
FIG. 2 illustrates a portion of the conduction band for the device of FIG. 1.

Electron leakage is exacerbated by naturally-occurring polarization in wurtzite crystals. The crystal layers in III-nitride devices grown on lattice-mismatched substrates such as sapphire are often grown as strained wurtzite crystals. Such crystals exhibit two types of polarization: spontaneous polarization, which arises from the crystal symmetry, and piezoelectric polarization, which arises from strain. The total polarization in a layer is the sum of the spontaneous and piezoelectric polarization. A polarization-induced sheet charge occurs at the interface between layers of different composition. In general, the density of a sheet charge will depend upon both the spontaneous polarization and the piezoelectric polarization due to strain between the two adjacent layers. FIG. 2 illustrates a portion of the conduction band of the device of FIG. 1. The sign and location of the sheet charges are indicated by "+" and "−" signs in FIG. 2.

Conventional growth on a typical substrate, such as sapphire or SiC, results in the wurtzite c-axis orientation indicated at 18 in FIG. 2. Across the interface between the active region and the p-type layers, the c-axis points toward the p-type layers. This orientation results in a positive sheet charge at the interface between GaN spacer layer 13 and p-type AlGaN layer 14. In the device illustrated in FIG. 1, the interface 17 between GaN spacer layer 13 and p-type AlGaN layer 14 is intended to form a "barrier" to confine conduction band electrons in the active region. It is to be understood that GaN spacer layer 13 may be omitted, other materials may form the barrier, and that the problem with a positive sheet charge at the interface forming the barrier may be generalized to other devices. The positive sheet charge at the interface reduces the effective height of the AlGaN barrier, permitting electrons to leak from the active region. Any leakage current recombines nonradiatively in the p-type layers and does not contribute to light emission from the device. As the current density increases, the amount of leakage current increases, contributing to the decrease in internal quantum efficiency at high current density. Also, leakage current is present even at low current densities, reducing the overall peak efficiency of the device.

In the III-nitride device illustrated in FIG. 1, the direction of current flow (i.e. the motion of positive charge carriers, or holes) is antiparallel to the direction of the [0001] c-axis. This relative arrangement of the current flow and polarization arises from the relative ease of growing Mg-doped p-type III-nitride material after the n-type region rather than before, and the conditions used for conventional growth of high quality III-nitride layers by MOCVD on sapphire substrates, which provide an excess of Ga compared to N present on the crystal surface, resulting in the positive direction of the [0001] c-axis pointing out of the surface of the film. Because the p-type region is placed on top of the n-type region, current will flow from the top of the wafer towards the substrate.

In accordance with embodiments of the invention, the light emitting region of a semiconductor light emitting device has the reverse-polarization of a conventional III-nitride semiconductor light emitting device. "Reverse-polarization" refers to reversing the relative arrangement of current flow with respect to the [0001] c-axis, such that the current flow is parallel to the [0001] c-axis, not antiparallel as in the device of FIG. 1. Reversing the polarization in the light emitting region may reduce leakage current, potentially increasing the light generating efficiency.

Figure 3:
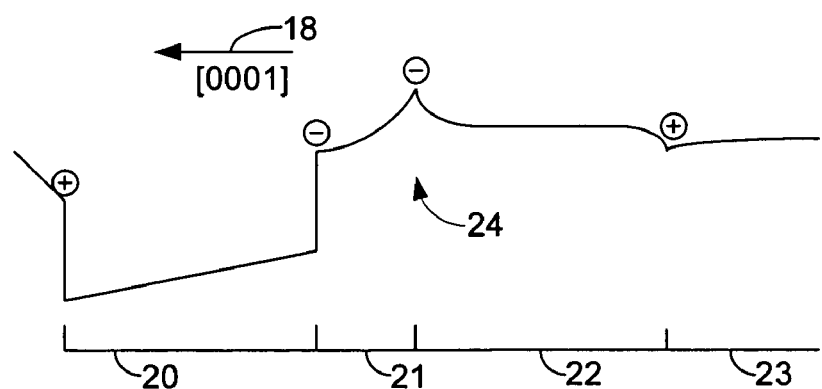
FIG. 3 illustrates a portion of the conduction band for a device according to embodiments of the invention.

FIG. 3 illustrates a portion of the conduction band of a device according to embodiments of the invention. In the device illustrated in FIG. 3, the barrier on the p-side of the light emitting layer, which confines charge carriers in light emitting layer 20, is disposed between spacer layer 21, which may be GaN, and layer 22, which may be p-type AlGaN. Across the interface between the light emitting region and the p-type region, between layers 20 and 21, the c-axis points toward the light emitting region, as indicated at 18 in FIG. 3. In this orientation, the current flow under forward bias operating conditions is parallel to the c-axis. This orientation results in a negative sheet charge at the barrier 24 (the interface between layers 21 and 22), which increases the barrier height, reducing the electron current that leaks past light emitting region 20. In embodiments of the invention, light emitting region 20 may be a single thick or thin light emitting layer, as illustrated in FIG. 3, or may include multiple quantum wells separated by barrier layers, as illustrated in FIG. 2. In some embodiments, spacer layer 21 may be doped n-type or not intentionally doped. Since spacer layer 21 is located on the p-side of the light emitting layer, spacer layer 21 is considered part of the p-type region of the device, even if spacer layer 21 is n-type or undoped.

Figure 12:
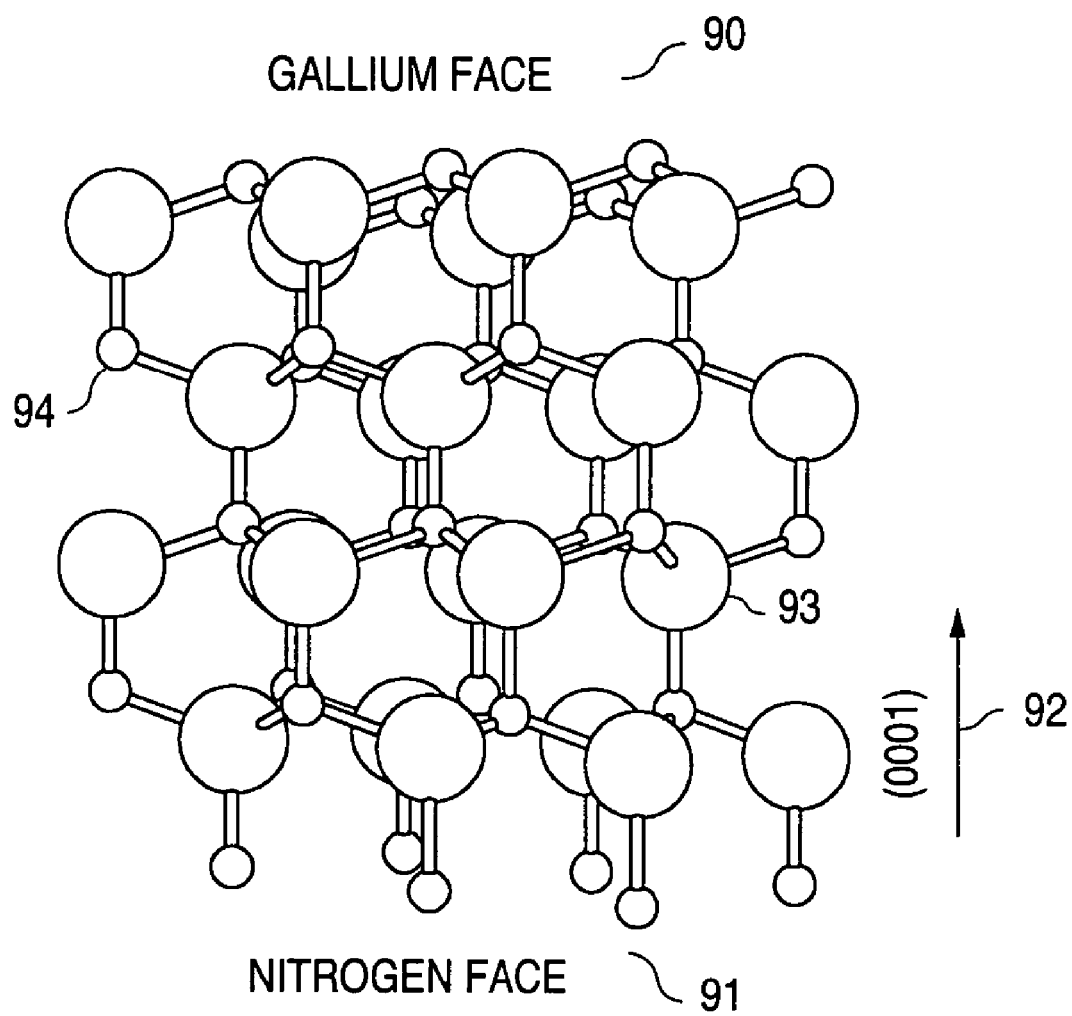
FIG. 12 illustrates a unit cell of wurtzite GaN.

FIG. 12 illustrates a unit cell of wurtzite GaN, formed from gallium atoms 93 and nitrogen atoms 94. Wurtzite GaN has a gallium face 90 and a nitrogen face 91. The c-axis 92 points from the nitrogen face 91 to the gallium face 90. The exposed, top surface of GaN created by, for example, conventional growth on a c-plane sapphire substrate, is the gallium face 90. Growth on the gallium face 90 of a GaN surface results in the c-axis orientation illustrated in FIG. 2. The buried surface of GaN adjacent to the sapphire after conventional growth on c-plane sapphire is the nitrogen face 91. In embodiments of the invention, epitaxial structures are grown conventionally such that the gallium face is exposed. The epitaxial structure is then bonded to another epitaxial structure or a host substrate and the growth substrate is removed, such that the nitrogen face is exposed. As a result of growth or processing after bonding, the light emitting region in the resulting device is oriented such that the nitrogen face is the crystal surface facing the p-type region, and an interface between the light emitting region and the p-type region has the c-axis orientation illustrated in FIG. 3.

The bond is preferably spaced apart from the light emitting region, such that after processing is complete, a device structure defined as a portion of n-type region proximate to one side of the light emitting region, the light emitting region, and a portion of the p-type region proximate to the other side of the light emitting region, is uninterrupted by the bond. For example, in some embodiments the bond may be spaced at least 500 nm from an edge of the light emitting region. The epitaxial surface that is bonded to another epitaxial structure or a host structure may be p-type, n-type, or undoped.

Figure 4:
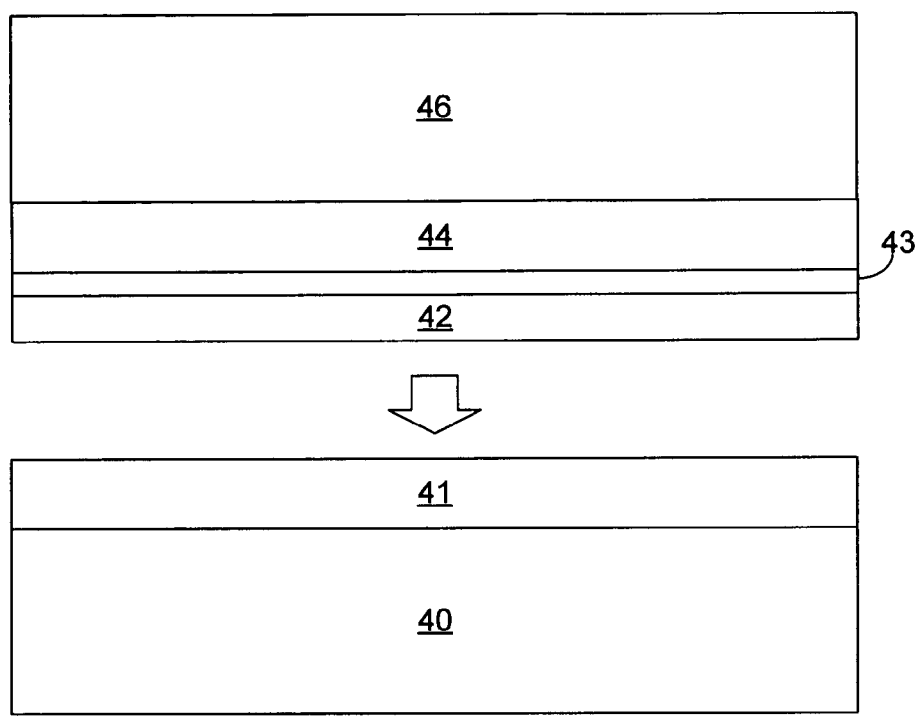
FIG. 4 illustrates bonding two epitaxial structures together.

FIG. 4 illustrates a first method of forming a device with the c-axis orientation of the light emitting region illustrated in FIG. 3. Two separate epitaxial structures are grown on growth substrates 40 and 46. Growth substrates may be any suitable growth substrate, such as, for example, sapphire, SiC, AlN, or GaN. An optional n-type, p-type, or undoped region 41, referred to below as an n-type region, may be grown over substrate 40. A first region 44, which may be n-type, p-type, or undoped, but is referred to below as an n-type region, light emitting region 43, and a second n-type region 42 are grown over substrate 46. Light emitting region 43 may be, for example, a single thin or thick light emitting layer, or multiple quantum wells separated by barrier layers. N-type region 44, which, after later processing, is located on the p-side of the active region, may include a GaN layer adjacent to light emitting region 43, such as layer 21 of FIG. 3, and an AlGaN layer adjacent to the GaN layer, such as layer 22 of FIG. 3. Other regions which may be n-type, p-type, or undoped may separate n-type region 44 from substrate 46, and may be formed over n-type region 42 (i.e., between n-type region 42 and the bonded interface with region 41). N-type region 44 or any other region between substrate 46 and light emitting region 43 may include release layers designed to facilitate release of the growth substrate by simple chemical etching, or thinning of the epitaxial layers after substrate removal.

The top surface of the semiconductor structure grown on substrate 46, n-type region 42 in FIG. 4, and the surface of n-type region 41 are bonded together under elevated temperature and pressure. An appropriate temperature for bonding may be, for example, between 500 and 1500° C.; an appropriate pressure for bonding may be, for example, between 5 and 1500 psi. The surfaces may be pressed together at the above temperature and pressure in an atmosphere of, for example, $N_2$ for a specified time period, for example, at least 2 minutes, often for at least 30 minutes. Under these conditions, a robust semiconductor bond is formed between the two surfaces. Such a bond may withstand the temperatures necessary for further semiconductor processing subsequent to bonding, such as growing additional semiconductor layers. Other bonding techniques besides semiconductor wafer bonding may be used, such as diffusion soldering bonding. In a diffusion soldering bond, one or more metals such as Zn and Sn are deposited at the bonded interface and bonded at low temperature. The ZnSn bond is stable at high temperatures, for example temperatures greater than 900° C. In another alternative method, the surfaces are bonded using a thin metallic film such as Al as a bonding layer. The Al may alloy into the two semiconductor surfaces, creating a bond that is stable at high temperatures. In some embodiments, one or more dielectric layers such as $SiO_2$, $Si_3N_4$, SiON, $TiO_2$, $SiO_2$, SnO$_2$, ZrO$_2$, ZnO, MgF$_2$, Al$_2$O$_3$ may form one of the bonded surfaces or may be disposed between the two bonded surfaces.

Bond 50 (FIG. 5) may be formed between two GaN surfaces, between an InGaN surface and a GaN surface, between two InGaN surfaces, or between any other suitable surfaces. Alternatively, the bond may be formed directly between GaN or InGaN and a non-III-nitride host substrate, such as an Al$_2$O$_3$, Si or SiC substrate. For example, substrate 40 and n-type region 41 of FIG. 4 may be replaced by a Si, SiC, or Al$_2$O$_3$ substrate without any epitaxial layers grown on the replacement substrate. Alternatively, the host substrate may be a dielectric distributed Bragg reflector. "Wavelength-Converted Semiconductor Light Emitting Device," United States Patent Application Publication No. US 2006/0202105 A1, which is incorporated herein by reference, describes a ceramic body which may be used as a host substrate. In some embodiments, the host substrate must be able to tolerate the conditions required for any processing to take place after the bond. The two bonded surfaces may be optionally smoothed prior to bonding, for example by polishing by conventional methods. In some embodiments, the two epitaxial structures are grown in conditions that favor formation of smooth surfaces for bonding.

Figure 5:
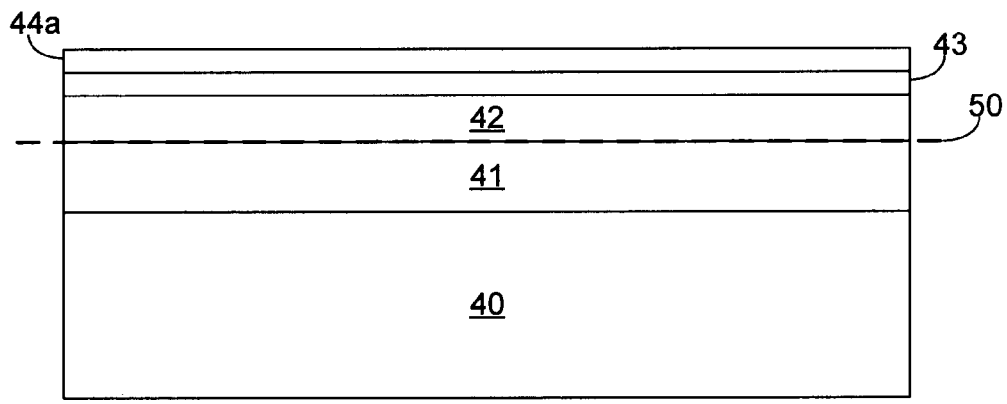
FIG. 5 illustrates the device of FIG. 4 after removal of one growth substrate and optional thinning of the exposed epitaxial layer.

After bonding, substrate 46 from the top device is removed, as illustrated in FIG. 5. A sapphire growth substrate may be removed by exposing, through substrate 46, portions of the interface between substrate 46 and crystal region 44 to a high fluence pulsed ultraviolet laser in a step and repeat pattern. The exposed portions may be isolated by trenches etched through the crystal layers of the device, in order to isolate the shock wave caused by exposure to the laser. Such etching is done prior to bonding. The photon energy of the laser is above the band gap of the crystal layer adjacent to the sapphire (GaN in some embodiments), thus the pulse energy is effectively converted to thermal energy within the first 100 nm of epitaxial material adjacent to the sapphire. At sufficiently high fluence (i.e. greater than about 500 mJ/cm$^2$) and a photon energy above the band gap of GaN and below the absorption edge of sapphire (i.e. between about 3.44 and about 6 eV), the temperature within the first 100 nm rises on a nanosecond scale to a temperature greater than 1000° C., high enough for the GaN to dissociate into gallium and nitrogen gasses, releasing the epitaxial layers from substrate 46. Other substrates, such as SiC, Si, and engineered substrates based on Si may be removed by conventional processes, such as etching and/or lapping.

After removal of substrate 46, the resulting structure in the example of FIG. 5 includes epitaxial n-type region 44, active region 43, and n-type region 42 bonded through bond 50 to n-type region 41 and substrate 40. After substrate 46 is removed, n-type region 44a (FIG. 5) may be thinned to just above light emitting region 43 by dry etching, wet etching such as photoelectrochemical etching, and/or chemical mechanical polishing.

Figure 6:
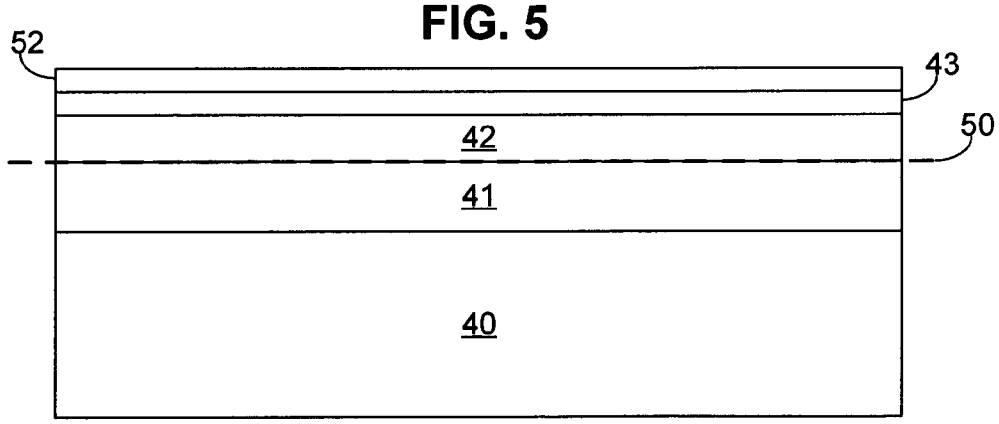
FIG. 6 illustrates the device of FIG. 5 after diffusion or implantation of p-type dopant.

A p-type region is then formed over light emitting region 43. In FIG. 6, p-type region 52 is formed by diffusing a p-type dopant such as Mg into thinned n-type region 44b, thus converting the conductivity of this region from n-type to p-type. For example, Mg and Au may be thermally evaporated on the surface of n-type region 44a, then heated, for example to a temperature of 900° C. for six hours. The remaining Mg and Au are then removed by etching, and the device annealed, for example at a temperature between 850 and 1050° C., to activate the diffused Mg. Alternatively, a p-type dopant such as Mg (often co-implanted with P) or Be (often co-implanted with O) may be implanted into n-type region 44b. For example, a Ni layer may be formed on n-type region 44b to protect the surface during implant, then Be metal and O$_2$ gas are used to implant Be and O into n-type region 44b at an energy greater than 50 keV and a dosage between 10$^{13}$ cm$^{-2}$ and 10$^{16}$ cm$^{-2}$. The Ni is then removed and the device is annealed at a temperature greater than 900° C. to activate the implanted dopant. Implantation may also be used to increase the doping level of an already p-type material, for example p-type region 52 described below in reference to FIG. 7.

Figure 7:
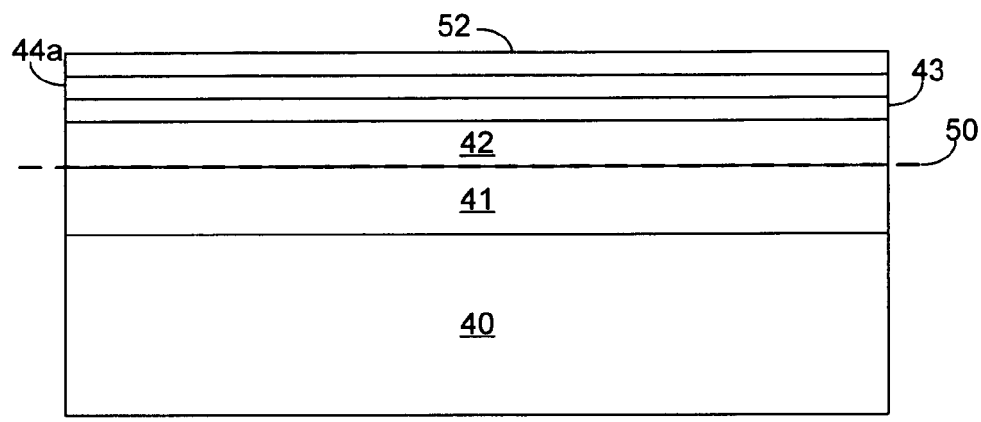
FIG. 7 illustrates the device of FIG. 5 after regrowth of a new p-type region.

In FIG. 7, p-type region 52 is grown over thinned n-type region 44a. P-type region 52 may be grown in conventional growth conditions, after an optional cleaning of the surface by, for example, etching. Regrowth of p-type region 52 is possible because every structure in the device, including semiconductor bond 50, can withstand the high temperatures required for III-nitride growth.

The surface of n-type region 44 exposed by removal of substrate 46 is the nitrogen face. Accordingly, p-type region 52, whether formed by diffusion or implantation of a p-type dopant into an n-type region or by growth on the exposed n-type region, will also have the nitrogen face up, resulting in the desirable c-axis orientation between the active region and the p-type region illustrated in FIG. 3. Nitrogen-face films may be grown by, for example, molecular beam epitaxy or MOCVD, as described in more detail in "Morphological and structure characteristics of homoepitaxial GaN grown by metalorganic chemical vapour deposition (MOCVD)," Journal of Crystal Growth 204(1999) 419-428 and "Playing with Polarity", Phys. Stat. Sol. (b) 228, No. 2, 505-512 (2001), both of which are incorporated herein by reference. The devices illustrated in FIGS. 6 and 7 are now ready for conventional flip chip processing, which requires etching a mesa to expose a portion of one of n-type regions 42 or 41, forming transparent or reflective contacts on n-type region 42 or 41 and p-type region 52, and mounting the device such that light is extracted either through the contacts (in the case of transparent contacts) or through substrate 40 (in the case of reflective contacts). Alternatively, the device may be processed as a thin film device, wherein the surface of p-type region 52 in either of FIGS. 6 and 7 may be metal-bonded to a host substrate through a bond that forms a contact to p-type region 52, then substrate 40 may be removed, a contact may be formed on the exposed surface of n-type region 41, and the device may be mounted such that light is extracted through the exposed surface of n-type region 41. In embodiments where the host substrate is a dielectric distributed Bragg reflector, a vertical cavity laser or a resonant cavity light emitting diode may be formed.

Figure 8:
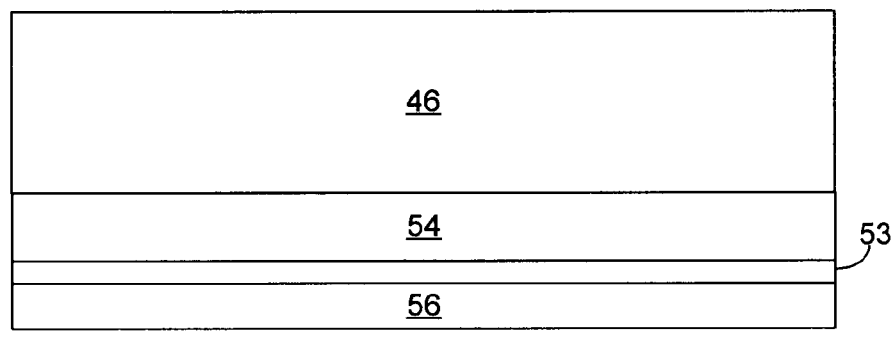
FIG. 8 illustrates bonding two epitaxial structures together.
Figure 8:
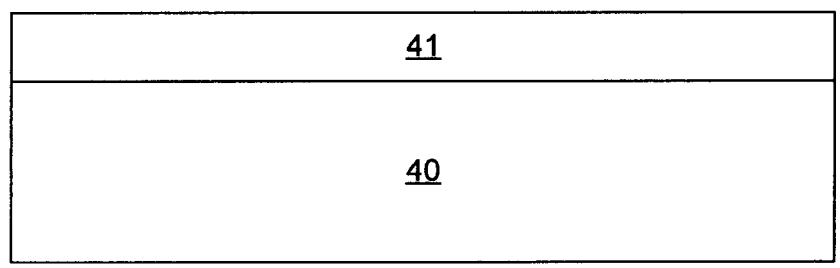

FIG. 8 illustrates a second method of forming a device according to FIG. 3. As in FIG. 4, two separate epitaxial structures are grown on growth substrates 40 and 46. As in FIG. 4, n-type, p-type, or undoped region 41, referred to below as an n-type region, is grown over substrate 40. Over substrate 46, p-type region 54 is grown first, followed by light emitting region 53 and n-type region 56. P-type region 54 may include a GaN layer adjacent to light emitting region 53, such as layer 21 of FIG. 3, and an AlGaN layer adjacent to the GaN layer, such as layer 22 of FIG. 3. Other regions which may be n-type, p-type, or undoped may separate p-type region 54 from substrate 46, and may be formed over n-type region 56 (i.e., between n-type region 56 and the bonded interface with region 41).

Figure 9:
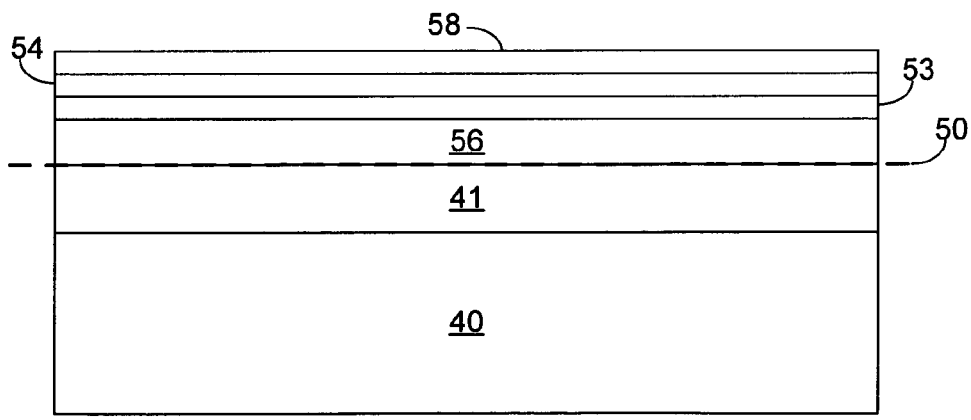
FIG. 9 illustrates the device of FIG. 8 after removal of one growth substrate and optional regrowth of a new p-type region.

The top surface of the semiconductor structure grown on substrate 46, n-type region 56 in FIG. 8, and the surface of n-type region 41 are bonded together under similar conditions as those described in reference to FIG. 4. As described above, n-type region 41 may be omitted and n-type region 56 may be directly bonded to a suitable host structure. Substrate 46 is then removed, as described above, and p-type region 54 may optionally be thinned. P-type region 54 may include release layers designed to facilitate release of the growth substrate by simple chemical etching, or thinning of the epitaxial layers after substrate removal. A second p-type region 58 may be grown on the surface of p-type region 54 after the removal of substrate 46, or a p-type dopant such as Mg may be diffused or implanted into p-type region 54, as illustrated in FIG. 9. In some embodiments, growth of a second p-type region, diffusion, or implantation are necessary after thinning to recover from crystalline damage that occurs during thinning. Growth of a p-type region 58 after thinning may be desirable to space the damage caused by thinning apart from light emitting layer 53, since such damage may cause optical and electrical losses. Damage to the surface of p-type region 54 may be repaired by a high temperature anneal in $NH_3$. For example, the device may be annealed at a pressure of 200 Torr and a temperature of 850 to 1000° C. A p-type dopant precursor such as $CP_2Mg$ may be added during the anneal to repair p-type region 54, or to further dope p-type region 54 to reduce contact resistance. The device illustrated in FIG. 9 may then be processed as a flip chip or thin film device, as described above.

Figure 10:
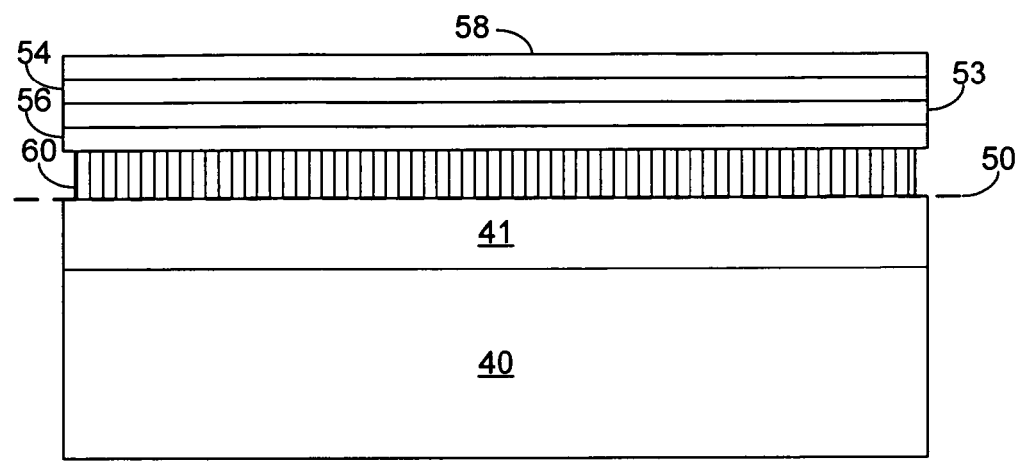
FIG. 10 illustrates a device incorporating a textured region.
Figure 11:
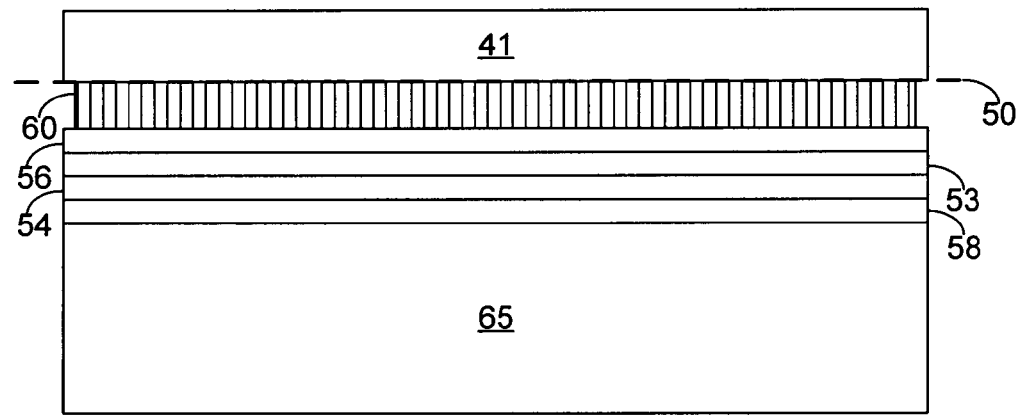
FIG. 11 illustrates the device of FIG. 10 after bonding to a host substrate and removing the second growth substrate.

In some embodiments, one surface is roughened or textured prior to bonding. FIGS. 10 and 11 illustrate embodiments that include a textured region 60. In some embodiments, textured region 60 is a photonic crystal region in the form of a periodic array of holes. Photonic crystal structures are described in more detail in U.S. Pub. No. 2003/0141507 titled "LED efficiency using photonic crystal structure," which is incorporated herein by reference. A photonic crystal structure may be a periodic structure, such as a lattice of holes, formed in the semiconductor layers of an LED, such as one or more semiconductor layers with a suitably chosen alloying stoichiometry of the elements Al, Ga, In, and N. The periodic array of holes has a lattice constant a, which may range from 0.1λ to 4λ, where λ is the wavelength of light emitting by the active region within the semiconductor structure. In other embodiments, features larger than 2 microns are formed in textured region 60. Textured region 60 is bonded to 41 by a bond 50 as illustrated in FIG. 10. The structure may then be flipped over and bonded to a host substrate 65 by a bond such as a metal bond (not shown) formed at the interface between p-type region 58 and host substrate 65, as illustrated in FIG. 11. Substrate 40 of FIG. 10 is then removed, and a contact (not shown) may be formed on the exposed surface of region 41, through which light is extracted from the device. Textured region 60 acts as a buried light scattering layer within the device, which may increase the amount of light extracted from the device. Though FIG. 11 illustrates a thin film device, the bonded device of FIG. 10 may also be processed into a flip chip device as described above. Also, though FIGS. 10 and 11 show a device similar to that shown in FIGS. 8 and 9, where the p-type region 54 is grown prior to the light emitting region 53, then the textured or roughened region is formed over n-type region 56, such a textured or roughened region may be incorporated into a device as illustrated in FIGS. 4, 5, 6, and 7, where the textured or roughened region is formed over n-type region 42, then bonded to region 41.

Figure 13:
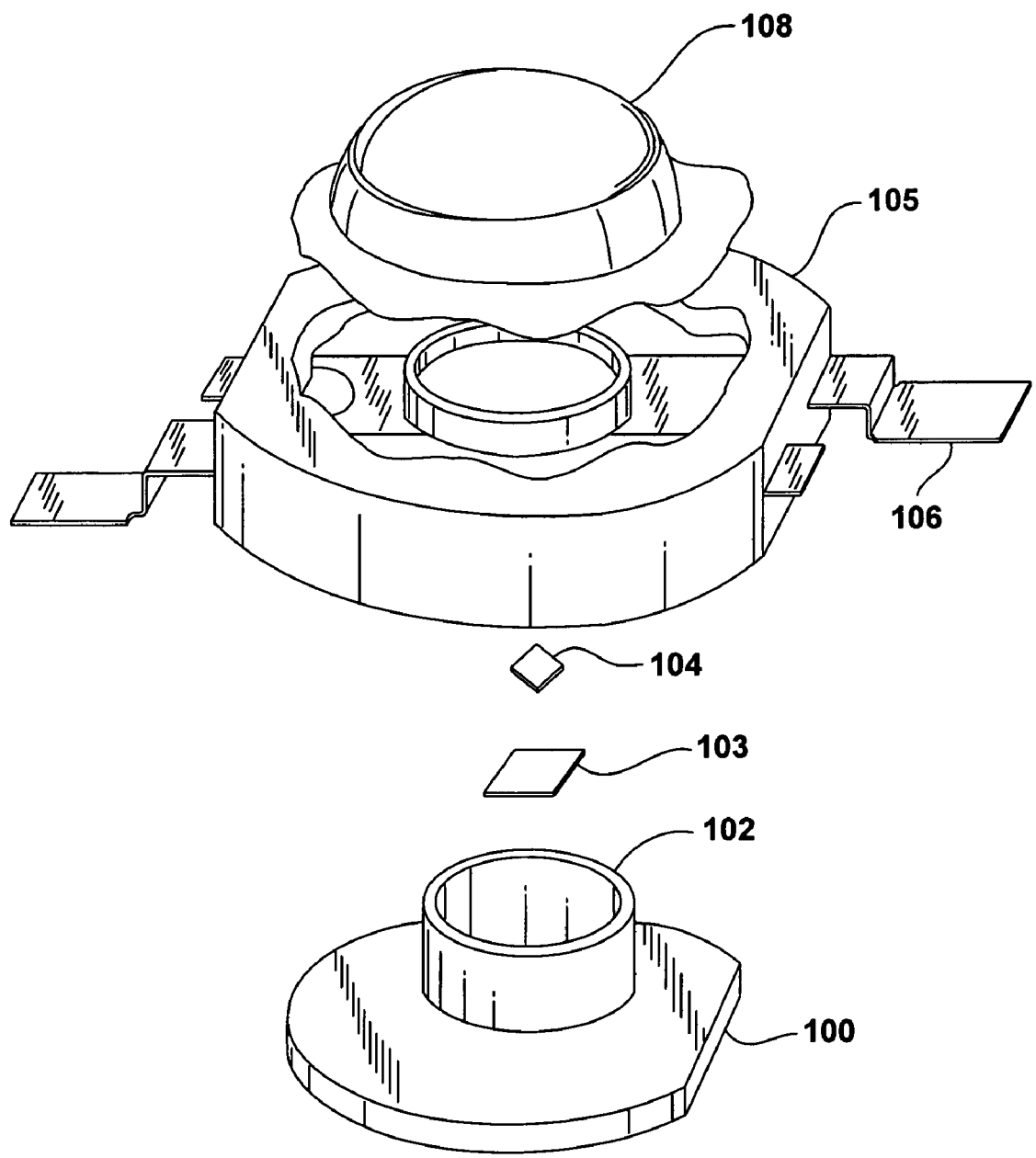
FIG. 13 is an exploded view of a packaged light emitting device.

FIG. 13 is an exploded view of a packaged light emitting device, as described in more detail in U.S. Pat. No. 6,274,924. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described above, is mounted directly or indirectly via a thermally conducting submount 103 to slug 100. A cover 108, which may be an optical lens, may be added.

The devices illustrated in FIGS. 7, 9 and 10 may be processed into edge-emitting or vertical-cavity surface emitting lasers. Reduced carrier leakage provided by these structures may improve the laser operating characteristics, such as the threshold current. The threshold current can be written as:

$$I_{th}=I_{tho}+I_l$$

where $I_{tho}$ is the current without leakage and $I_l$ is the leakage current. As the leakage current is reduced, so is the threshold current of the laser where stimulated emission begins. Accordingly, when leakage current is reduced, a laser can operate with lower operating input power. III-nitride lasers are limited to a wavelength range from near UV (390 nm) to blue (460 nm). Lowering the current threshold where stimulated emission begins may expand the potential operating wavelength of III-nitride lasers into UV and toward green. The current leakage also limits the total output power of the lasers, so by reducing this leakage, embodiments of the present invention may enable higher power III-nitride lasers. As in prior art III-nitride lasers, the light-emitting device structure may be grown on low dislocation templates for increased reliability.

Figure 15:
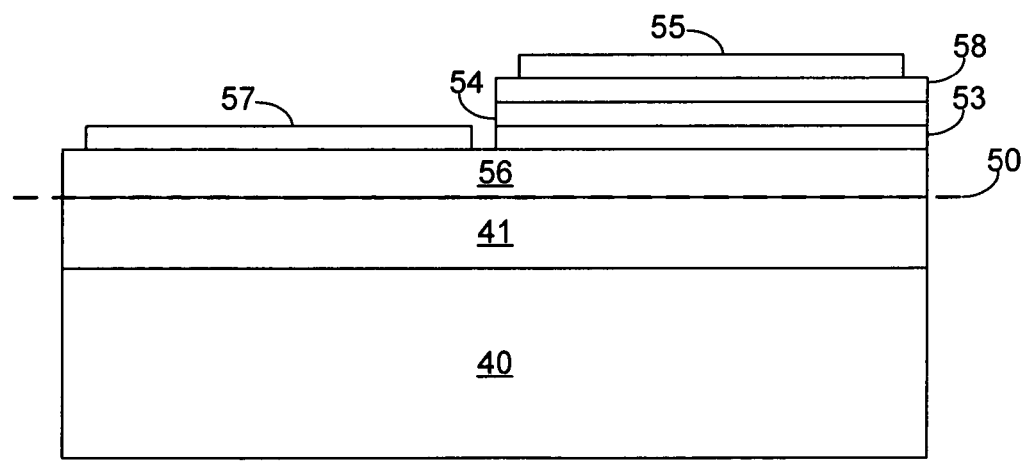
FIG. 15 illustrates a laser according to embodiments of the invention.

An edge emitting laser is illustrated in FIG. 15. The device of FIG. 15 contains the same epitaxial layers as FIG. 9, though a laser may also be formed with the same epitaxial layers as FIGS. 6 or 7. A stripe mesa structure is etched to n-type region 56 layer to define the laser cavity width and to reveal n-type region 56 for contacting. N-contact 57 and p-contact 55 are deposited and defined with standard techniques. The cavity is defined length-wise (out of the page) by dry-etching or cleaving the laser facets. An additional AlGaN cladding layer may be added between regions 53 and 56 to confine the optical laser mode in the vertical direction.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A structure comprising:
    a device structure comprising a III-nitride light emitting region disposed between a p-type region and an n-type region, the light emitting region comprising a wurtzite crystal structure; and
    a non-III-nitride material disposed between two surfaces, wherein:
    one of the surfaces is a surface of a wurtzite crystal portion of the device structure, the wurtzite crystal portion of the device structure comprising alternating layers of group III atoms and group V atoms, wherein the surface of the wurtzite crystal portion of the device structure comprises a surface of a layer of group III atoms; and
    the other of the surfaces is a surface of a wurtzite crystal portion of a second structure, the wurtzite crystal portion of the second structure comprising alternating layers of group III atoms and group V atoms, wherein the surface of the wurtzite crystal portion of the second structure comprises a surface of a layer of group III atoms; and
    the non-III-nitride material is in direct contact with the two surfaces;

wherein across an interface disposed between the light emitting region and the p-type region, a wurtzite c-axis, defined as pointing from a nitrogen face of a III-nitride unit cell to a group III atom face of the III-nitride unit cell, points toward the light emitting region.

2. The structure of claim 1 wherein the two surfaces are both GaN surfaces.

3. The structure of claim 1 wherein one of the two surfaces is selected from the group of GaN, AlN, and InGaN.

4. The structure of claim 1 wherein the surface of the wurtzite crystal portion of the device structure is a III-nitride surface that is one of p-type, n-type, and undoped.

5. The structure of claim 1 wherein one of the two surfaces is textured.

6. The structure of claim 5 wherein the textured surface comprises a periodic array of holes formed in the textured surface.

7. The structure of claim 6 wherein the periodic array of holes has a lattice constant between $0.1\lambda$ and $4\lambda$, wherein $\lambda$ is a wavelength of light in the light emitting region.

8. The structure of claim 1 wherein the non-III-nitride material is a metal layer.

9. The structure of claim 1 wherein the non-III-nitride material is a metal-semiconductor alloy.

10. The structure of claim 1 further comprising contacts electrically connected to the n-type region and the p-type region.

11. The structure of claim 1 further comprising:
a mesa including a portion of the light emitting region; and
laser facets disposed on opposite ends of the mesa.

12. The structure of claim 1 wherein the device structure and the second structure are separately-grown III-nitride structures.

13. The structure of claim 8 wherein the metal layer comprises one of Zn and Sn.

14. The structure of claim 9 wherein the metal-semiconductor alloy comprises Al.

15. The structure of claim 1 wherein the non-III-nitride material is a dielectric.

16. The structure of claim 1 wherein the non-III-nitride material is an oxide of silicon.

* * * * *